United States Patent [19]
Ernkell et al.

[11] Patent Number: 5,633,878
[45] Date of Patent: May 27, 1997

[54] SELF-DIAGNOSTIC DATA BUFFERS

[75] Inventors: Mats Ernkell, Stockholm; Stefan Sahl, Hägersten, both of Sweden

[73] Assignee: Telefonaktiebolaget LM Ericsson, Stockholm, Sweden

[21] Appl. No.: 376,147

[22] Filed: Jan. 20, 1995

[51] Int. Cl.$^6$ .............................. G11C 29/00; G06F 11/00
[52] U.S. Cl. ...................... 371/24; 371/21.2; 395/183.18; 364/265.3; 364/266.4; 365/201
[58] Field of Search .............................. 371/24, 27, 67.1, 371/71, 21.1, 21.2, 40.1; 365/201, 221, 230.01, 189.01, 189.02, 189.05; 364/265.3, 266.4, 944.92; 395/185.07, 183.18

[56] References Cited

U.S. PATENT DOCUMENTS

| | | | |
|---|---|---|---|
| 3,751,649 | 8/1973 | Hart, Jr. | 371/21.3 |
| 3,940,601 | 2/1976 | Henry et al. | 371/21 |
| 4,130,240 | 12/1978 | Millham et al. | 364/200 |
| 4,667,330 | 5/1987 | Kumagai | 371/71 |
| 4,811,294 | 3/1989 | Kobayashi et al. | 371/21 |
| 4,831,625 | 5/1989 | Chiu et al. | 371/25 |
| 4,835,774 | 5/1989 | Oashima et al. | 371/71 |
| 5,233,610 | 8/1993 | Nakayama et al. | 371/5.1 |
| 5,469,443 | 11/1995 | Saxena | 371/21.3 |

FOREIGN PATENT DOCUMENTS

| | | |
|---|---|---|
| 0 185924A2 | 7/1986 | European Pat. Off. . |
| 0 312238A3 | 4/1989 | European Pat. Off. . |
| 0 377 894 | 7/1990 | European Pat. Off. . |
| 4244275C | 7/1994 | Germany . |

Primary Examiner—Hoa T. Nguyen
Assistant Examiner—Trinh L. Tu
Attorney, Agent, or Firm—Burns, Doane, Swecker & Mathis, L.L.P.

[57] ABSTRACT

A self-diagnostic asynchronous data buffer includes an addressable buffer having a write address determined by a write counter and a read address determined by a read counter. A write clock controls storage into the buffer and updating of the write counter. A read clock controls reading from the buffer and updating of the read counter. The self-diagnostic asynchronous data buffer additionally has a test register, an address counter, and a state machine. To determine whether a hardware fault exists, the state machine compares the address counter output with the output of the write counter. When the two are equal, the next write to the addressable buffer causes the input data to also be stored in the test register. Next, the address counter output is compared with the output of the read counter. When the two addresses are equal, the output data from the addressable buffer is compared to the value stored in the test register. Inequality between these two values indicates a hardware fault. In an alternative embodiment, a parallel asynchronous data buffer operates by storing into a parity register a parity value of the input data, rather than the input data itself. When the address counter output is equal to the output address of the read counter, parity of the output data from the data buffer is computed and then compared with the value stored in the parity register. Inequality between these two values indicates a hardware fault.

8 Claims, 4 Drawing Sheets

SELF-DIAGNOSTIC DATA BUFFERS

BACKGROUND

The present invention relates to electronic data buffers, and more particularly to asynchronous data buffers having a self-diagnostic capability for detecting a hardware fault.

Electronic data buffers are utilized in many applications. In the field of telecommunications, asynchronous buffers are used, for example, to transfer digital data between two systems having different reference clocks. That is, a stream of data is clocked into the buffer under the control of a first system's reference clock (henceforth referred to as a "write clock" (WCLK)), and is stored until it is read out of the buffer in response to assertion of the second system's reference clock (henceforth referred to as a "read clock" (RCLK)), which operates asynchronously with respect to the WCLK. The buffer will typically include hardware to ensure that data is clocked out in the same order in which it was clocked in.

A conventional asynchronous buffer 100 is illustrated in FIG. 1. The buffer includes a decoder 101, having N (preferably $=2^m$) outputs, only one of which is active at a time. An m-bit wide write address (WADR) signal 119 that is provided by a write counter 103 selects which of the N decoder signals will be active. The N output signals from the decoder 101 are supplied to N corresponding write enable (WEN) inputs of an N-register buffer 105. A common data input (DIN) signal 107 is supplied to the inputs of each of the N registers contained in the N-register buffer 105. If the DIN signal 107 is only 1-bit wide, then the asynchronous buffer 100 is said to be a serial buffer. If the DIN signal 107 is more than 1-bit wide, then each of the N registers in the N-register buffer 105 is similarly configured, and the asynchronous buffer 100 is said to be a parallel buffer.

When a WCLK signal 109 is asserted, the value of the DIN signal 107 will be stored into that one of the N registers that has its corresponding WEN line simultaneously asserted. The WCLK signal 109 is also supplied to an input of the write counter 103 in order to modify the WADR signal 119 (e.g., by incrementing) in preparation for the next write operation. Writing to the asynchronous buffer 100 continues in this manner, under the control of a first system (not shown).

At the same time, a second system (not shown) controls the retrieval of the data stored in the asynchronous buffer 100. A read operation occurs with every assertion of a RCLK signal 111. (Hardware for latching the data out (DOUT) signal 113 with each assertion of the RCLK signal 111 is presumed to be part of the second system, and is not illustrated in FIG. 1.) Generation of the DOUT signal 113 is accomplished as follows. Outputs from each of the N registers contained in the N-register buffer 105 are supplied to corresponding inputs of an N:1 multiplexor (MUX) 115. Selection of one of the inputs for use as the DOUT signal 113 is controlled by an m-bit wide read address (RADR) signal 121 that is supplied by a read counter 117. The RCLK signal 111 that is used by the second system for latching the DOUT signal 113 is also supplied to an input of the read counter 117 in order to modify the RADR signal 121 (e.g., by incrementing) in preparation for the next read operation. The cycle of RADR values must be the same as the cycle of WADR values in order ensure that all DIN values supplied to the asynchronous buffer 100 are also retrieved. Reading from the asynchronous buffer 100 continues in this manner under the control of the second system (not shown).

In the exemplary conventional asynchronous buffer 100, both the write counter 103 and the read counter 117 perform modulo $2^m$ increments (or alternatively decrements) of the respective WADR and RADR signals 119, 121. Consequently, each of these address values will "wrap around" to an initial address after generating all $2^m$ different address values. This makes it necessary to perform read operations with the same average frequency as write operations in order to prevent data stored in the N-register buffer 105 from being overwritten by newer data before it has been retrieved by the second system. That is, the respective values in the write counter 103 and the read counter 117 must never pass each other, in order to avoid a slip in the data flow (i.e., the occurrence of a data value, stored in the buffer 105, being read twice or not at all). A phase locked loop (PLL) or a "stuffing" procedure may be implemented to prevent these problems from occurring. Detailed explanations of these well-known techniques are beyond the scope of this description, however, since they do not assist an understanding of the invention.

In systems that utilize an asynchronous buffer, such as the one illustrated in FIG. 1, it is often a requirement that the buffer have a self-diagnostic capability, meaning that the buffer itself contains hardware that detects the occurrence of a hardware fault. This added function requires correspondingly additional hardware. One problem with providing this self-diagnostic capability arises from the fact that if the additional hardware is too complex, then the likelihood that the additional hardware is the source of a hardware fault increases.

SUMMARY

It is therefore an object of the present invention to provide an asynchronous buffer having a self-diagnostic capability.

It is a further object of the present invention to provide this self-diagnostic capability with very little additional hardware.

In accordance with one aspect of the present invention, the foregoing and other objects are achieved in a self-diagnostic asynchronous data buffer comprising addressable storage means including a plurality of addressable storage cells; data input means for receiving an input data value to be stored into one of the plurality of addressable storage cells; means for generating a write address that identifies one of the plurality of storage cells into which the input data value is to be written during a next write operation; and means for generating a read address that identifies one of the plurality of storage cells from which an output data value will be read during a next read operation. For determining whether a hardware fault exists the self-diagnostic asynchronous buffer further includes means for generating a test address signal; test storage means for storing the input data value during the next write operation when the test address signal equals the write address; and means for comparing the value stored in the test storage means with the output data value during the next read operation when the test address signal equals the read address, and for asserting a hardware fault signal in response to the output data value not being equal to the value stored in the test storage means. Thus, the inventive asynchronous data buffer stores, in a dedicated register, the input data supplied by a first system, and also keeps track of the buffer address into which that data was stored. When that data is retrieved by a second system, the inventive asynchronous data buffer compares it to the value that was stored in the dedicated register. Any inequality indicates a hardware fault.

In accordance with another feature of the present invention, the self-diagnostic asynchronous data buffer stores into a dedicated register a bit representing parity of the input data, rather than the input data itself. The buffer address to which this parity bit corresponds is also stored. When a read operation to this buffer address is detected, parity of the output data is computed, and compared with the previously stored parity value. Inequality between these two values indicates a hardware fault. This feature is useful for implementing a parallel asynchronous data buffer, where the width of the data would otherwise require a corresponding increase in the width of the test register and data comparison hardware.

BRIEF DESCRIPTION OF THE DRAWINGS

The objects and advantages of the invention will be understood by reading the following detailed description in conjunction with the drawings in which.

DETAILED DESCRIPTION

Figure 1:
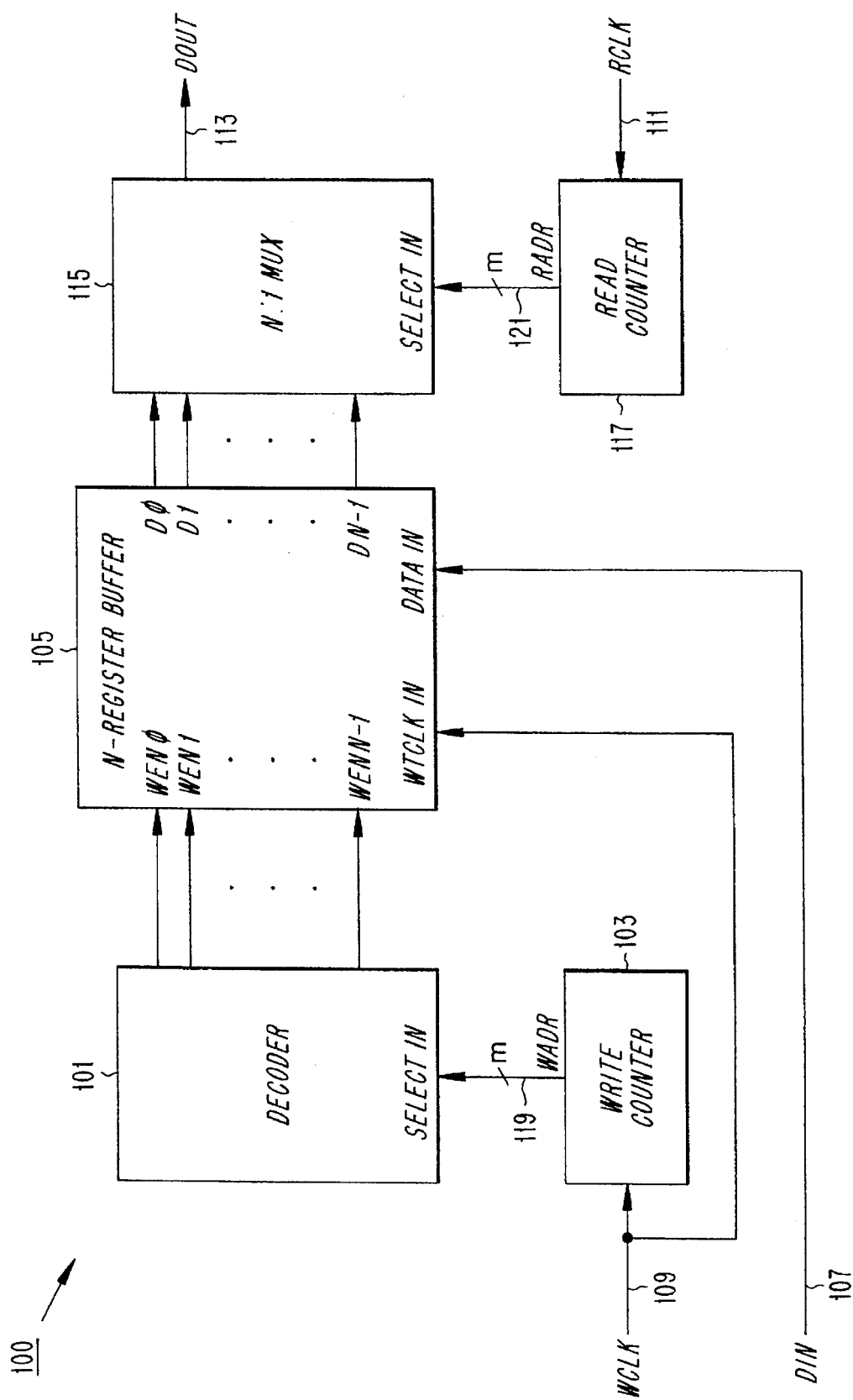
FIG. 1 is a block diagram of a conventional asynchronous buffer.
Figure 2:
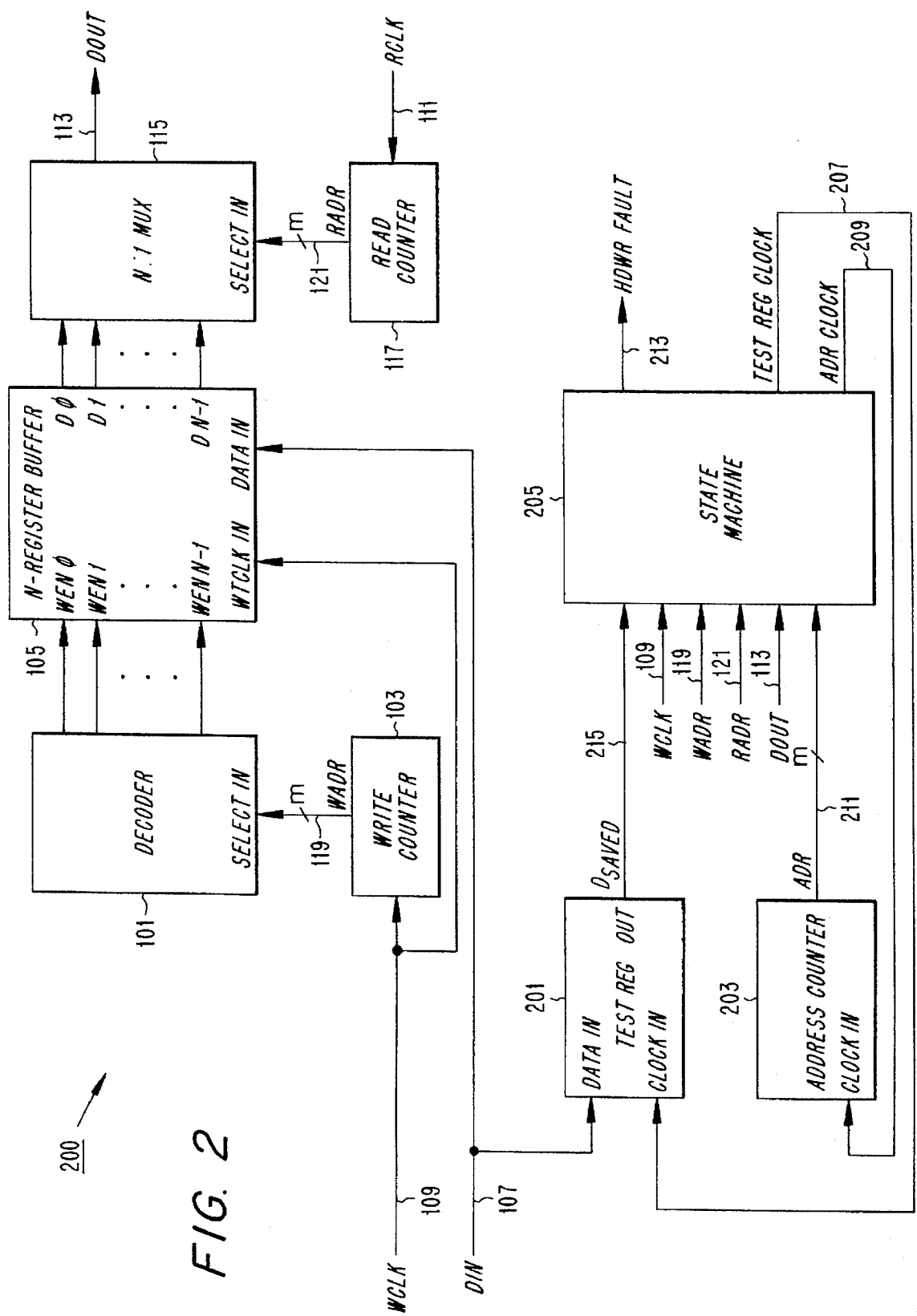
FIG. 2 is a block diagram of an exemplary embodiment of a self-diagnostic asynchronous buffer in accordance with the present invention.

Referring to FIG. 2, a block diagram of an exemplary embodiment of an asynchronous buffer 200 having self-diagnostic capability in accordance with the present invention is shown. The decoder 101, write counter 103, N-register buffer 105, N:1 MUX 115 and read counter 117 function as described above in the BACKGROUND section, and need not be described again here.

In order to detect hardware faults, the asynchronous buffer 200 further includes a test register 201, an address counter 203, and a state machine 205. The state machine is preferably implemented as an interconnection of gates and flip-flops, the design of which is generated by a computer program from a high-level description of the state machine behavior written in a resister-transistor logic (RTL) language. Inputs to the state machine 205 are the WCLK signal 109, the WADR signal 119, the RADR signal 121, the DOUT signal 113, a $D_{SAVED}$ signal 215 that is supplied by the test register 201, and an m-bit address (ADR) signal 211 that is supplied by the address counter 203. The state machine 205 generates a test register clock signal 207 for clocking data into the test register 201, and an address clock signal 209 for updating (e.g., incrementing) the value of the m-bit ADR signal 211 that is generated by the address counter 203. The state machine 205 also generates a hardware fault signal 213 as follows.

First, the value of the WADR signal 119 is compared with the value of the ADR signal 211. When the two are equal, the state machine 205 generates the test register clock signal 207 so that it coincides with the WCLK signal 109. This may be implemented, for example, by using the output of a comparator (comparing the WADR signal 119 and the ADR signal 211) to gate the WCLK signal 109 to the test register clock signal 207 output of the state machine 205. When the test register clock signal 207 is generated, the test register 201 will store the same value that is simultaneously being written into the selected register contained in the N-register buffer 105.

Next, the state machine 205 compares the value of the RADR signal 121 with the value of the ADR signal 211. When the two are equal, the value of the DOUT signal 113 is compared with the value of the $D_{SAVED}$ signal 215. If the two are equal, then no hardware fault exists. However, if there is a mismatch between the two signals, then a hardware fault exists. Therefore, in response to this mismatch the state machine 205 asserts the hardware fault signal 213.

After performing the comparison between the DOUT signal 113 and the $D_{SAVED}$ signal 215, the state machine 205 generates the address clock signal 209 in order to update (e.g., increment) the value of the m-bit ADR signal 211 to the next N-register buffer address that is to be tested. The testing procedure then repeats the steps described above.

The embodiment depicted in FIG. 2 is preferably implemented as a serial buffer, in which the DIN signal 107, as well as the $D_{SAVED}$ signal 215 are each only 1-bit wide. This permits the test register 201 to be realized as a D-flip flop, and also minimizes the necessary hardware for comparing the current output and saved data values. Nonetheless, the same technique may also be applied to implement a parallel asynchronous data buffer simply by increasing the width of the test register 201 to match that of the DIN signal 107, and to similarly adjust the width of the hardware for comparing the DOUT and $D_{SAVED}$ signals 113, 215.

An alternative embodiment of a parallel asynchronous data buffer will now be described with respect to FIG. 3. For parallel buffers, this technique is preferred over that described above with respect to FIG. 2, because it requires less hardware. As mentioned earlier, the more hardware that is required to implement the self-diagnostics, the more likely it is that the self-diagnostic hardware will itself be the source of a hardware fault.

Figure 3:
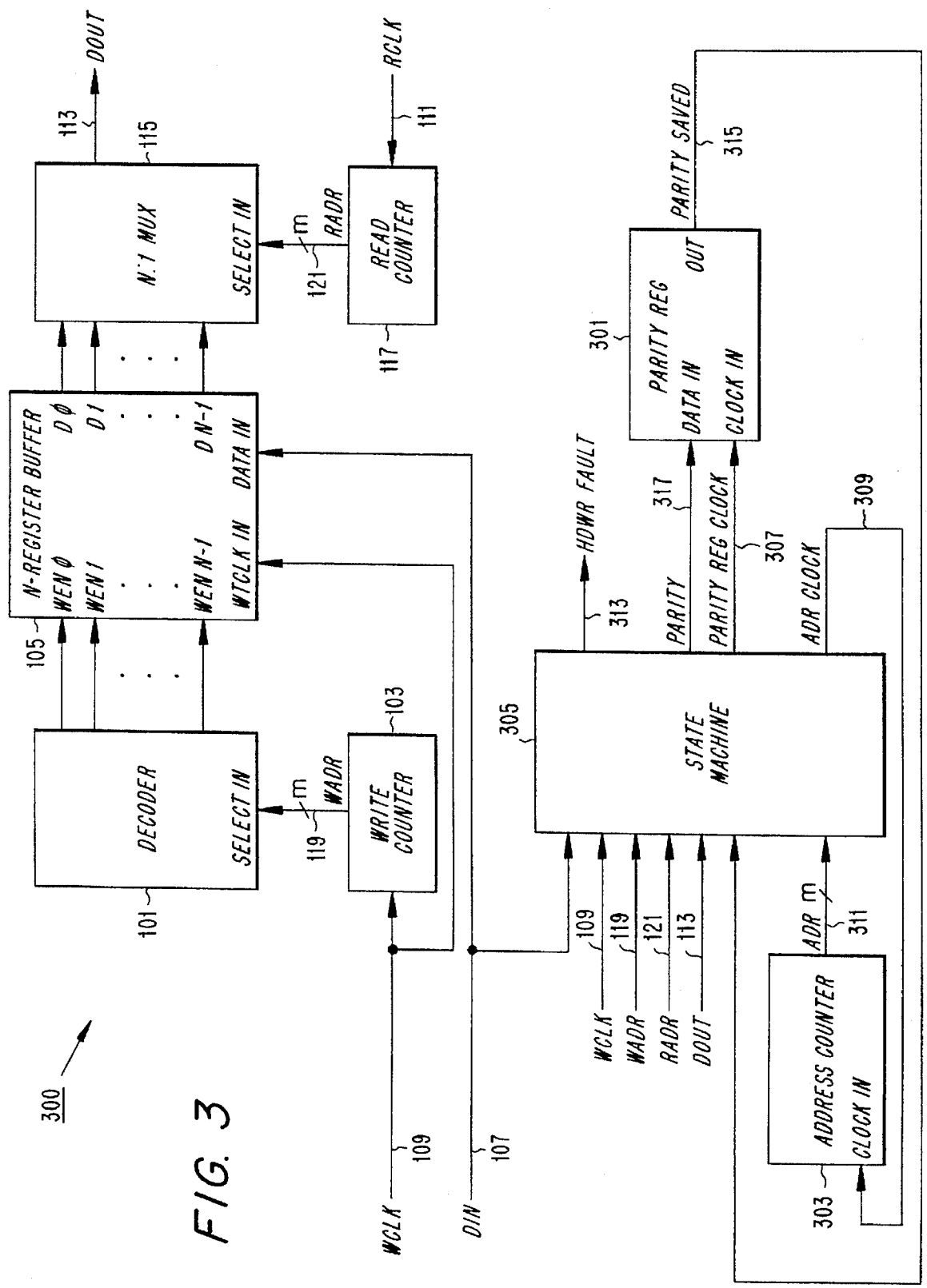
FIG. 3 is a block diagram of a self-diagnostic parallel asynchronous data buffer in accordance with an alternative embodiment of the present invention.

Referring now to FIG. 3, the exemplary parallel asynchronous buffer 300 having self-diagnostic capability in accordance with the present invention includes a decoder 101, a write counter 103, an N-register buffer 105, an N:1 MUX 115 and a read counter 117 which all function as described above in the BACKGROUND section, and need not be described again here.

In order to detect hardware faults, the parallel serial asynchronous buffer 300 further includes a parity register 301, an address counter 303, and a state machine 305. Inputs to the state machine 305 are the WCLK signal 109, the WADR signal 119, the RADR signal 121, the DOUT signal 113, a $PARITY_{SAVED}$ signal 315 that is supplied by the parity register 301, and an m-bit address (ADR) signal 311 that is supplied by the address counter 303. The state machine 305 generates a parity register clock signal 307 for clocking a parity signal 317 into the parity register 301. The state machine 305 also generates an address clock signal 309 for updating (e.g., incrementing) the value of the m-bit ADR signal 311 that is generated by the address counter 303. The state machine 305 additionally generates a hardware fault signal 313 in accordance with the following steps.

First, the value of the WADR signal 119 is compared with the value of the ADR signal 211. When the two are equal, the state machine 305 generates the parity register clock signal 307 so that it coincides with the WCLK signal 109. This may be implemented, for example, by using the output of a comparator (comparing the WADR signal 119 and the ADR signal 311) to gate the WCLK signal 109 to the parity register clock signal 307 output of the state machine 305. Coincident with the parity register clock signal 307, the state machine 305 also provides the parity signal 317 to the data input port of the parity register 301. The parity signal 317 is computed to indicate parity (either even or odd) of the DIN signal 107. When the parity register clock signal 307 is asserted, the parity register 301 will store the value of the parity signal 317. This value, which then becomes available as the PARITY$_{SAVED}$ signal 315 that is supplied by the parity register 301, is also the expected parity of the value that has been written into the selected register contained in the N-register buffer 105.

Next, the state machine 305 compares the value of the RADR signal 121 with the value of the ADR signal 311. When the two are equal, the state machine 305 computes the parity of the value of the DOUT signal 113, and compares this computed parity value with the value of the PARITY$_{SAVED}$ signal 315. If the two values are equal, then no hardware fault exists. However, if there is a mismatch between the two signals, then a hardware fault exists. Therefore, in response to this mismatch the state machine 305 asserts the hardware fault signal 313.

After performing the comparison between the DOUT signal 113 and the PARITY$_{SAVED}$ signal 315, the state machine 305 generates the address clock signal 309 in order to update (e.g., increment) the value of the m-bit ADR signal 311 to the next N-register buffer address that is to be tested. The testing procedure then repeats the steps described above.

The foregoing description of the invention has relied on the assumption that a "slip" in the data flow never occurs, that is, that the respective values in the write counter 103 and the read counter 117 never pass each other, so that no data value, once stored in the buffer 105, is ever read twice or not read at all. In a system in which slips are expected to occur during normal operation, the invention should be modified slightly to avoid reporting such slips as hardware errors. These modifications will now be described with respect to the flow chart depicted in FIG. 4.

Figure 4:
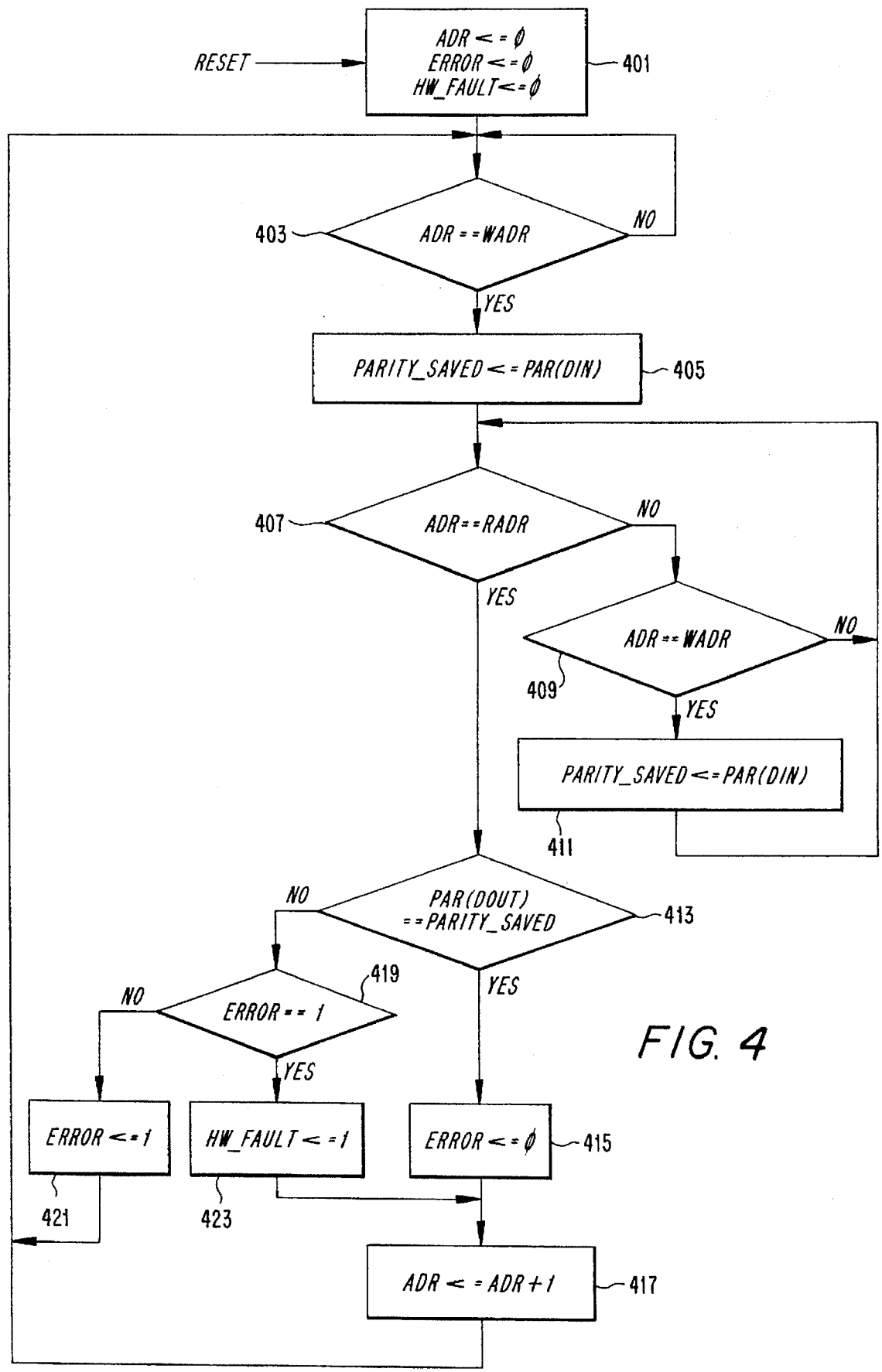
FIG. 4 is a flow chart showing an alternative embodiment of the present invention which permits the occurrence of expected slips in the data flow.

The steps depicted in FIG. 4 relate to an embodiment of the present invention such as that described above with respect to FIG. 3, in which the parity of the stored data value, instead of the data value itself, is temporarily stored by the diagnostic hardware in a parity register 301. However, those having ordinary skill in the art will readily be able to adapt these teachings to an embodiment in which the data itself is stored in a test register 201.

Referring now to FIG. 4, upon the assertion of a reset signal at block 401, the address of the location to be tested, represented by the value of the ADR signal 311, is initialized to zero. Also at block 401, the hardware fault signal 313 and an ERROR flag are both initialized to indicate the absence of any detected hardware fault. The ERROR flag, the use of which is explained below, may be a latch that is internal to the state machine 305.

Next, the WADR signal 119 is compared with the value of the ADR signal 311 (block 403). So long as the values are not equal, the comparison at block 403 is repeated.

When the WADR signal 119 equals the ADR signal 311, then the parity of the DIN signal 107 (i.e., the parity signal 317) is stored into the parity register 301 (block 405).

Next, the value of the ADR signal 311 is compared with the value of the RADR signal 121 (block 407) in order to detect when a read to the supervised address is occurring. If the two values are not the same, then another comparison between the ADR signal 311 and the WADR signal 119 is made (block 409) to account for the possibility that another write operation to the same address is being performed. If the addresses are equal, then the new parity value of the DIN signal 107 is stored into the parity register 301, replacing the previous value (block 411). It is noted that since the previous value was never read, this represents a "slip" in the data flow.

The loop comprising blocks 407, 409 and possibly 411 is repeated until the value of the RADR signal 121 equals the value of the ADR signal 311, at which point execution continues by comparing the parity of the DOUT signal 113 with the value of the PARITY$_{SAVED}$ signal 315 (block 413).

When the hardware is not faulty, the two values match, and execution proceeds first to block 415, where the ERROR flag is again set to indicate the absence of an error, and then to block 417, where the value of the ADR signal 311 is incremented in preparation for testing (also called "supervising") the next address location. Next, execution continues back at block 403 to start the process for testing the next address location.

If the parity of the DOUT signal 113 does not match the value of the PARITY$_{SAVED}$ signal 315 (block 413), then a hardware fault may or may not have been detected. The reason for the uncertainty arises from the fact that both a write and a read operation to/from the same address location could have occured during the execution of block 407. In such a case, the parity of the DOUT signal 113 would not correspond to the value of the PARITY$_{SAVED}$ signal 315. However, this should not be construed as a hardware error. To determine whether this is, or is not the case, the ERROR flag is tested (block 419) to see whether or not it has been set. If it has not been previously set, then it is set (block 421), and the entire loop is repeated for the same value of the ADR signal 311. If, during the first pass of the loop, both a write and read had occured at block 407 (thereby causing the ERROR flag to be set at block 421), then during the second pass, the test at block 413 will determine that the parity of the DOUT signal 113 is now equal to the value of the PARITY$_{SAVED}$ signal 315. In this case, execution proceeds to block 415, where the ERROR flag is reset, and then onto block 417 to update the value of the ADR signal 311.

Alternatively, if during the first pass of the loop block 419 had been executed for a reason other than the occurence of a simultaneous read and write to the same address during execution of block 407, then the test at block 413 will again fail when executed during the second pass of the loop. In this instance, the second performance of the test at block 419 will determine that the ERROR flag has been set, and execution will proceed to block 423. At block 423, the hardware fault signal 313 is asserted, and execution continues at block 417 to prepare for testing the next address location as described above.

Note that the operations described in FIG. 4 result in the hardware fault signal 313 remaining asserted once a hardware fault is detected. However, the skilled artisan will readily be able to adapt this design for application in an environment in which the hardware fault signal 313 is to be asserted for a finite amount of time only, and then reset if no other faults are detected. For example, if at block 413 the value of the parity of the DOUT signal 113 is found to be equal to the value of the PARITY$_{SAVED}$ signal 315, the hardware fault signal 313 could again be reset (e.g., at block 415), in order to enable the detection of multiple faults in the buffer 105.

The invention has been described with reference to particular embodiments. However, it will be readily apparent to those skilled in the art that it is possible to embody the invention in specific forms other than those of the preferred embodiment described above. This may be done without departing from the spirit of the invention.

For example, the particular implementation of the asynchronous buffer need not be those illustrated in FIGS. 2 and 3, but may instead be any asynchronous buffer that automatically maintains separate write and read addresses and which utilizes separate write and read clocks.

The invention may also be applied to provide self-diagnostic capability to a random access memory-based (RAM-based) buffer. In this case, the decoder 101, N-register buffer 105 and N:1 MUX 115 are replaced by a single dual-port RAM.

The invention may further be applied to provide self-diagnostic capability to a true synchronous buffer that may be used, for example, to make phase adjustments in digital high speed designs. In this case, the write and read clocks are the same clock.

Thus, the preferred embodiments are merely illustrative and should not be considered restrictive in any way. The scope of the invention is given by the appended claims, rather than the preceding description, and all variations and equivalents which fall within the range of the claims are intended to be embraced therein.

What is claimed is:

1. A self-diagnostic asynchronous data buffer, comprising:
   addressable storage means including:
   a plurality of addressable storage cells;
   data input means for receiving an input data value to be stored into one of the plurality of addressable storage cells;
   means for generating a write address that identifies one of the plurality of storage cells into which the input data value is to be written during a next write operation; and
   means for generating a read address that identifies one of the plurality of storage cells from which an output data value will be read during a next read operation;
   means for generating a test address signal;
   means for determining whether or not the test address signal equals the write address;
   test storage means for storing the input data value during the next write operation when the test address signal equals the write address;
   means for determining whether or not the test address signal equals the read address; and
   means for comparing the value stored in the test storage means with the output data value during the next read operation when the test address signal equals the read address, and for asserting a hardware fault signal in response to a comparison indicating that the output data value is not equal to the value stored in the test storage means.

2. The self-diagnostic asynchronous data buffer of claim 1, wherein the addressable storage means further includes:
   means for updating the write address after the next write operation; and
   means for updating the read address after the next read operation.

3. The self-diagnostic asynchronous data buffer of claim 2, further comprising means for updating the test address signal in response to the value stored in the test storage means being compared with the output data value.

4. A self-diagnostic asynchronous data buffer, comprising:
   addressable storage means including:
   a plurality of addressable storage cells;
   data input means for receiving an input data value to be stored into one of the plurality of addressable storage cells;
   means for generating a write address that identifies one of the plurality of storage cells into which the input data value is to be written during a next write operation; and
   means for generating a read address that identifies one of the plurality of storage cells from which an output data value will be read during a next read operation;
   means for generating a test address signal;
   means for generating an input data parity value that is indicative of parity of the input data value;
   means for determining whether or not the test address signal equals the write address;
   parity storage means for storing the input data parity value during the next write operation when the test address signal equals the write address;
   means for generating an output data parity value that is indicative of parity of the output data value;
   means for determining whether or not the test address signal equals the read address;
   means for comparing the value stored in the parity storage means with the output data parity value during the next read operation when the test address signal equals the read address, and for asserting a hardware fault signal in response to a comparison indicating that the output data parity value is not equal to the value stored in the parity storage means.

5. The self-diagnostic asynchronous data buffer of claim 4, wherein the addressable storage means further includes:
   means for updating the write address after the next write operation; and
   means for updating the read address after the next read operation.

6. The self-diagnostic asynchronous data buffer of claim 5, further comprising means for updating the test address signal in response to the value stored in the parity storage means being compared with the output data parity value.

7. In a system having addressable storage means comprising a plurality of addressable storage cells, data input means for receiving an input data value to be stored into one of the plurality of addressable storage cells specified by a write address during a write operation, and data output means for supplying an output data value from one of the plurality of addressable storage cells specified by a read address during a read operation, a method of testing the addressable storage means comprising the steps of:
   generating a test address;
   comparing the test address to the write address, and if the test address corresponds to the write address then storing the input data value into test storage means during the write operation, the test storage means thereafter supplying the stored input data value as a test data value at an output of the test storage means;
   comparing the test address to the read address; and
   if the test address corresponds to the read address then performing a test procedure comprising the steps of:
   comparing the test data value with the output data value; and
   if the test data value is not equal to the output data value, then asserting a hardware fault signal.

8. In a system having addressable storage means comprising a plurality of addressable storage cells, data input means for receiving an input data value to be stored into one of the plurality of addressable storage cells specified by a write address during a write operation, and data output means for supplying an output data value from one of the plurality of addressable storage cells specified by a read address during a read operation, a method of testing the addressable storage means comprising the steps of:

generating a test address;

comparing the test address to the write address, and if the test address corresponds to the write address then performing a first test procedure during the write operation, the first test procedure comprising the steps of:

generating an input data parity value that is indicative of parity of the input data value; and storing the input data parity value into parity storage means, the test storage means thereafter supplying the stored input data parity value as a test parity value at an output of the test storage means;

comparing the test address to the read address; and if the test address corresponds to the read address then performing a test procedure comprising the steps of:

generating an output data parity value that is indicative of parity of the output data value;

comparing the test parity value with the output data parity value; and if the test parity value is not equal to the output data parity value, then asserting a hardware fault signal.

* * * * *